United States Patent
Geerlings

(10) Patent No.: US 11,009,760 B2
(45) Date of Patent: May 18, 2021

(54) INTERLEAVING LASER ABLATION

(71) Applicant: Gentex Corporation, Zeeland, MI (US)

(72) Inventor: Kurtis L. Geerlings, Zeeland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 409 days.

(21) Appl. No.: 15/940,915

(22) Filed: Mar. 29, 2018

(65) Prior Publication Data

US 2018/0321566 A1 Nov. 8, 2018

Related U.S. Application Data

(60) Provisional application No. 62/501,916, filed on May 5, 2017.

(51) Int. Cl.
*G02F 1/157* (2006.01)
*B23K 26/0622* (2014.01)
(Continued)

(52) U.S. Cl.
CPC .......... *G02F 1/157* (2013.01); *B23K 26/0006* (2013.01); *B23K 26/0624* (2015.10);
(Continued)

(58) Field of Classification Search
CPC ......... B60R 1/088; B60R 1/12; B60R 1/1207; B60R 2001/1215; B60R 1/04; B60R 2001/1223; B60R 1/08; B60R 1/082; B60R 1/06; B60R 1/02; B60R 1/086; B60R 2001/1253; B60R 11/02; B60R 1/0602; B60R 2011/0033; B60R 11/0217; B60R 11/0235; B60R 11/0241; B60R 11/0247;
(Continued)

(56) References Cited

U.S. PATENT DOCUMENTS

| 5,501,944 A | 3/1996 | Hill et al. |
| 5,668,663 A | 9/1997 | Varaprasad et al. |

(Continued)

FOREIGN PATENT DOCUMENTS

| CA | 2644218 A1 | 9/2007 |
| CN | 1648715 A | 8/2005 |

(Continued)

OTHER PUBLICATIONS

English Translation of Office Action Issued in Japanese Application No. 2017-565946, dated Feb. 4, 2019, 6 pages.
(Continued)

*Primary Examiner* — William R Alexander
*Assistant Examiner* — Sharrief I Broome
(74) *Attorney, Agent, or Firm* — Foley & Lardner LLP; Bradley D. Johnson

(57) ABSTRACT

A product includes a substrate, at least one of a conductive layer or a coating layer, and an ablated surface on the substrate. The substrate is at least partially transparent to visible light. The at least one of the conductive layer or the coating layer are disposed over at least a portion of the substrate. The ablated surface includes an interleaved surface profile having a plurality of non-overlapped laser spots and a plurality of overlapped laser spots formed by subjecting the substrate to an interleaving laser ablation process.

18 Claims, 11 Drawing Sheets

(51) Int. Cl.
| | |
|---|---|
| *B23K 26/00* | (2014.01) |
| *B23K 26/08* | (2014.01) |
| *B23K 26/57* | (2014.01) |
| *B23K 26/352* | (2014.01) |
| *B23K 26/364* | (2014.01) |
| *B23K 26/402* | (2014.01) |
| *H05K 3/02* | (2006.01) |
| *H05K 1/03* | (2006.01) |
| *G02B 5/08* | (2006.01) |
| *H05K 1/02* | (2006.01) |
| *B23K 103/00* | (2006.01) |
| *B23K 101/20* | (2006.01) |
| *B23K 101/34* | (2006.01) |

(52) U.S. Cl.
CPC ........ *B23K 26/083* (2013.01); *B23K 26/0869* (2013.01); *B23K 26/352* (2015.10); *B23K 26/355* (2018.08); *B23K 26/364* (2015.10); *B23K 26/402* (2013.01); *B23K 26/57* (2015.10); *G02B 5/0808* (2013.01); *H05K 1/0274* (2013.01); *H05K 1/0296* (2013.01); *H05K 1/0306* (2013.01); *H05K 3/027* (2013.01); *B23K 2101/20* (2018.08); *B23K 2101/34* (2018.08); *B23K 2103/54* (2018.08); *G02F 2201/44* (2013.01); *H05K 2201/0108* (2013.01)

(58) Field of Classification Search
CPC ..... B60R 16/0215; G02F 1/157; G02F 1/161; G02F 1/163; G02F 1/155; G02F 1/153; G02F 1/1533; G02F 1/15; G02F 2201/44; G02F 2001/1536; G02F 1/15165; G02F 1/13338; G02F 1/133514; G02F 1/1523; G02F 1/01; G02F 1/133553; G02F 1/1503; G02F 1/1506; G02F 1/1508; G02F 1/167; G02F 2001/1552; B32B 17/10174; B32B 17/10513; B32B 17/10036; B32B 17/06; B32B 17/10321; B32B 2551/08; B32B 2307/416; B32B 17/10761; B32B 7/14; B32B 17/1022; B32B 17/10541; B32B 17/10733; B32B 17/10798; B32B 2605/08; B32B 2307/412; B32B 2605/00; B32B 2605/006; B32B 27/06; B32B 27/08; B32B 27/308; G02B 5/0808; G02B 30/27; G02B 5/08; G02B 2027/0118; G02B 5/04; G02B 5/10; G02B 17/00; G02B 1/14; G02B 2027/012; G02B 5/0875; G02B 5/201; G02B 5/23; G02B 6/00; G02B 17/04; G02B 1/111; G02B 1/18; G02B 2027/0156; G02B 26/001; G02B 26/004; G02B 26/005
See application file for complete search history.

(56) References Cited

U.S. PATENT DOCUMENTS

| | | | | |
|---|---|---|---|---|
| 6,066,830 | A | 5/2000 | Cline et al. | |
| 6,075,223 | A | 6/2000 | Harrison | |
| 8,842,358 | B2 | 9/2014 | Bareman et al. | |
| 8,927,069 | B1* | 1/2015 | Estinto | B32B 17/061 427/555 |
| 2002/0033558 | A1 | 3/2002 | Fahey et al. | |
| 2002/0044271 | A1 | 4/2002 | Leigh-Jones et al. | |
| 2003/0058986 | A1 | 3/2003 | Oshino et al. | |
| 2003/0075531 | A1 | 4/2003 | Kupisiewicz | |
| 2003/0127441 | A1 | 7/2003 | Haight et al. | |
| 2004/0031778 | A1 | 2/2004 | Koyama et al. | |
| 2005/0195488 | A1* | 9/2005 | McCabe | G02F 1/161 359/603 |
| 2005/0231105 | A1 | 10/2005 | Lovell et al. | |
| 2006/0020092 | A1 | 1/2006 | Chikusa et al. | |
| 2006/0134349 | A1 | 6/2006 | Chari et al. | |
| 2007/0206263 | A1 | 9/2007 | Neuman et al. | |
| 2008/0050888 | A1 | 2/2008 | Garner | |
| 2009/0212292 | A1 | 8/2009 | Hayton et al. | |
| 2010/0132988 | A1 | 6/2010 | Valentin et al. | |
| 2011/0017280 | A1 | 1/2011 | Rumsby | |
| 2011/0017602 | A1 | 1/2011 | Khosla | |
| 2011/0036802 | A1 | 2/2011 | Ronsin et al. | |
| 2012/0033285 | A1* | 2/2012 | Baumann | B60R 1/088 359/267 |
| 2012/0200007 | A1 | 8/2012 | Straw et al. | |
| 2012/0225250 | A1* | 9/2012 | Kuznetsov | H01B 1/08 428/156 |
| 2012/0229882 | A1 | 9/2012 | Fish et al. | |
| 2012/0273472 | A1 | 11/2012 | Unrath et al. | |
| 2013/0020297 | A1 | 1/2013 | Gupta et al. | |
| 2013/0081951 | A1* | 4/2013 | Hankey | C25D 11/16 205/50 |
| 2013/0112679 | A1 | 5/2013 | Van Wyhe et al. | |
| 2013/0153428 | A1 | 6/2013 | Akana et al. | |
| 2013/0248837 | A1 | 9/2013 | Yokoyama | |
| 2013/0337260 | A1 | 12/2013 | Tapio et al. | |
| 2014/0036338 | A1 | 2/2014 | Bareman et al. | |
| 2014/0176836 | A1* | 6/2014 | Brecht | G02F 1/133553 349/16 |
| 2015/0125626 | A1* | 5/2015 | Sakoske | C23C 18/06 427/556 |
| 2016/0093763 | A1* | 3/2016 | Rana | H01L 31/0682 438/57 |
| 2016/0114523 | A1* | 4/2016 | Luten | B23K 26/048 359/265 |
| 2016/0370680 | A1* | 12/2016 | Geerlings | G02F 1/155 |

FOREIGN PATENT DOCUMENTS

| | | |
|---|---|---|
| EP | 0 729 864 A1 | 9/1996 |
| EP | 1 503 906 B1 | 11/2011 |
| GB | 0 896 934 A | 5/1962 |
| JP | H08-253077 | 10/1996 |
| JP | 2009-508321 | 2/2009 |
| JP | 2008-524654 | 7/2009 |
| JP | 2009-529153 A | 8/2009 |
| JP | 2012-128457 A | 7/2012 |
| JP | 2012-168439 A | 9/2012 |
| RU | 2287414 C1 | 11/2006 |
| RU | 2390425 C1 | 5/2010 |
| TW | 201325798 A | 7/2013 |
| WO | WO-2008/119949 A1 | 10/2008 |
| WO | WO-2013/090209 A1 | 6/2013 |
| WO | WO-2014/060203 | 4/2014 |
| WO | WO-2014/060203 A1 | 4/2014 |

OTHER PUBLICATIONS

Foreign Action other than Search Report on CN 201580053989.5 dated Jul. 9, 2019, 11 pages with English Translation.
Foreign Action other than Search Report on EP 15828028.9 dated Jan. 23, 2020, 4 pages.
Foreign Action other than Search Report on EP 15846699.5 dated Jul. 9, 2019, 4 pages.
Foreign Action other than Search Report on KR 10-2018-7001504 dated Apr. 29, 2020, 6 pages with English translation.
Foreign Action other than Search Report on KR 10-2018-7001504 dated Feb. 26, 2020, 6 with English translation.
International Preliminary Report on Patentability issued on PCT/IB2018/052220 dated Nov. 5, 2019, 5 pages.
Non-Final Action issued on KR 1020187001504 dated Jul. 19, 2019, 18 pages with English translation.
Notice of Reasons for Refusal on JP 2017-565946 dated Nov. 25, 2019, 4 pages with English translation.
Office Action Issued in European Application No. 15828028.9, dated Mar. 18, 2019, 6 pages.

(56) References Cited

OTHER PUBLICATIONS

Extended European Search Report in EP16812567.2 dated May 7, 2018(10 pages).
Office Action issued in CN2015800539895 dated Jan. 10, 2018 (21 pgs. inc. translation).
U.S. Office Action on U.S. Appl. No. 15/186,164 dated Sep. 11, 2017.
Extended European Search Report issued in corresponding European Patent Application No. 15828028.9, dated Apr. 3, 2018.
International Search Report issued in PCT/IB2018/052220 dated Jul. 12, 2018.
Extended European Search Report in EP15846699.5 dated Sep. 25, 2017 (10 pages).
International Search Report and Written Opinion for PCT/US2015/042754 (8 pages).
International Search Report and Written Opinion for PCT/US2016/038199 dated Sep. 30, 2016 (17 pages).
International Search Report and Written Opinion in PCT/US2015/053850 dated Dec. 18, 2015 (10 pages).
U.S. Notice of Allowance on U.S. Appl. No. 14/874,263 dated Oct. 5, 2017.
U.S. Office Action on U.S. Appl. No. 14/874,263 dated Jan. 12, 2017.
U.S. Office Action on U.S. Appl. No. 14/874,263 dated Jul. 13, 2017.

* cited by examiner

INTERLEAVING LASER ABLATION

CROSS-REFERENCE TO RELATED PATENT APPLICATIONS

This application claims the benefit of U.S. Provisional Patent Application No. 62/501,916, filed May 5, 2017, which is incorporated herein by reference in its entirety.

TECHNICAL FIELD

The present disclosure generally relates to laser ablation processes and products produced thereby.

SUMMARY

One exemplary embodiment relates to a product. The product includes a substrate, at least one of a conductive layer or a coating layer, and an ablated surface on the substrate. The substrate is at least partially transparent to visible light. The at least one of the conductive layer or the coating layer are disposed over at least a portion of the substrate. The ablated surface includes an interleaved surface profile having a plurality of non-overlapped laser spots and a plurality of overlapped laser spots formed by subjecting the substrate to an interleaving laser ablation process.

Another exemplary embodiment relates to a product. The product includes a substrate having a first surface and an opposing second surface. The opposing second surface has a surface profile with a plurality of non-overlapped laser spots and a plurality of overlapped laser spots.

Still another exemplary embodiment relates to a mirror device. The mirror device includes a substrate. The substrate has a first surface, an opposing second surface, and a conductive layer disposed on the opposing second surface. The substrate has a surface profile including a plurality of non-overlapped laser spots and a plurality of overlapped laser spots.

BRIEF DESCRIPTION OF THE DRAWINGS

Illustrative embodiments will hereinafter be described in conjunction with the appended drawings, wherein like designations denote like elements.

DETAILED DESCRIPTION

Figure 1:
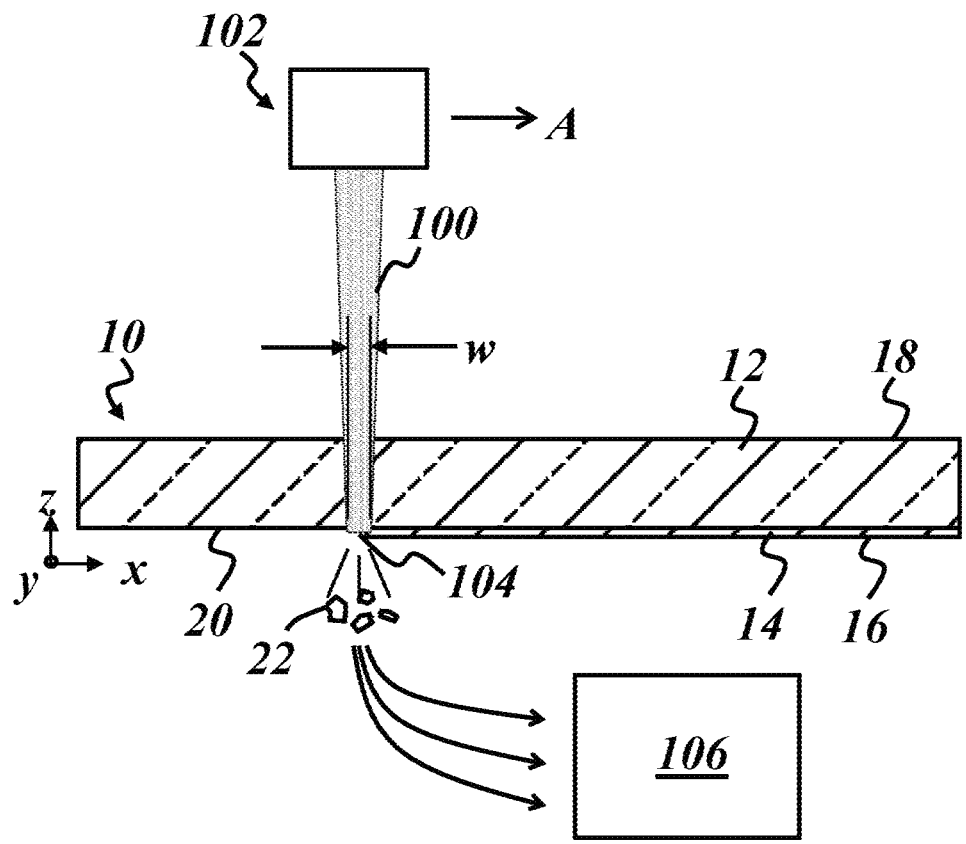
FIG. 1 is a side cross-sectional view of a second surface laser ablation process, according to an exemplary embodiment.

A laser ablation process generally includes selective removal of material at a surface of a workpiece by directing a laser beam at the workpiece. The laser beam is configured to deliver a controlled amount of energy at a laser spot defined where the beam impinges the desired surface. This controlled amount of energy is selected to liquefy, vaporize, or otherwise rapidly expand the surface material at the laser spot to cause it to separate from the workpiece for removal. Laser ablation can be used to remove at least a portion of one or more coatings from a coated substrate, for example, or to otherwise reshape the workpiece surface.

The laser ablation process may produce artifacts on the workpiece surface that create an undesired diffraction pattern when light is shone on or through the ablated surface. The diffraction effect is produced by artifacts with a periodic arrangement which are formed on the ablated surface (i.e., resulting from the fact that the laser ablation is accomplished using a series of spot ablations that are introduced sequentially along a path as opposed to being the result of a continuous laser "sweep" across the surface; this periodic arrangement of ablation points induces a corresponding periodic arrangement of artifacts, as will be described in greater detail below). In some cases, the diffraction effect may be present but exhibit a severity that is not objectionable.

The artifacts may produce a diffraction effect when the artifacts have a period (i.e., spacing) in the range of about 4,500 nm to about 850,000 nm. The artifacts may be arranged in rows, such that there is a periodic spacing of the artifacts within each row and a periodic spacing between adjacent rows. The rows may extend in the scan or process path direction of the ablation process, with the artifacts being formed by overlap of the laser spots in the scan direction (e.g., when using a non-interleaving laser ablation process, etc.). The artifacts in adjacent rows may or may not be aligned. The distance between the rows may be defined by the offset or pitch of the scan lines in the laser ablation process. In some embodiments, the period of the artifacts in the scan or process direction within the row may be about 45,000 nm, and the period between the rows in the line offset direction may be about 85,000 nm.

The height of the artifacts produced by the laser ablation process may also affect the diffraction severity. The height of the artifacts may be referred to as the "peak-to-valley" distance, and extends perpendicular or substantially perpendicular to the major plane in which the workpiece extends. The peak-to-valley distance that produces a diffraction severity of less than about 5 is impacted by the media adjacent to the surface containing the artifacts. In some embodiments where the adjacent medium is air, a diffraction severity of less than about 5 may be produced by a peak-to-valley distance of less than about 15 nm, such as less than about 10 nm, or less than about 7.5 nm. In other embodiments where the adjacent medium has a refractive index greater than 1, a diffraction severity of less than about 5 may be produced by a peak-to-valley distance of less than about 25 nm, such as less than about 18 nm, or less than about 13 nm. An adjacent medium with a refractive index greater than one may be any appropriate material, such as an electrochromic material when the ablated workpiece is included in an electrochromic device. Greater detail regarding diffraction severity may be found in U.S. patent application Ser. No. 15/186,164, filed on Jun. 17, 2016, which is incorporated by reference herein in its entirety.

FIG. 1 is a side cross-sectional view of an example of a laser ablation process as performed on a workpiece 10. The workpiece 10 is a coated substrate, including a substrate 12 and a coating layer 14. The illustrated process is a second surface ablation process in which the coating layer 14 is located at a second side 16 of the workpiece 10 opposite a first or impingement side 18 of the workpiece 10. A laser beam 100 is provided by a laser source 102 and propagates toward the workpiece. In this example, the laser beam 100 is configured with a focal plane at or near a second surface 20 of the substrate 12 and generally parallel with the x-y reference plane to define a laser spot 104 with a characteristic size such as a diameter or width w at the second surface. In other examples, the focal plane can be spaced from the second surface 20 by an amount greater than 0 mm up to about 50 mm. The substrate 12 is at least partially transparent to the particular wavelength of laser light of the laser beam 100 so that the laser beam 100 passes through the thickness of the substrate 12 to the second surface 20, where the material of the coating layer 14 absorbs at least some of the energy of the laser beam 100 and is thereby separated from the substrate 12.

In the example of FIG. 1, the removed coating layer material 22 is illustrated in the form of solid particles. The workpiece 10 can be oriented as shown so that gravity causes the removed material 22 to fall away from the workpiece 10. Optionally, a vacuum source 106 is provided to help guide the removed material 22 away from the workpiece 10. The removed material 22 may be in vapor or liquid form when initially separated from the substrate 12. The illustrated arrangement may be useful to prevent the removed material 22 from being redeposited on the workpiece 10, which can be problematic with some first surface ablation processes. The material may also be removed via a spallation process.

Figure 2:
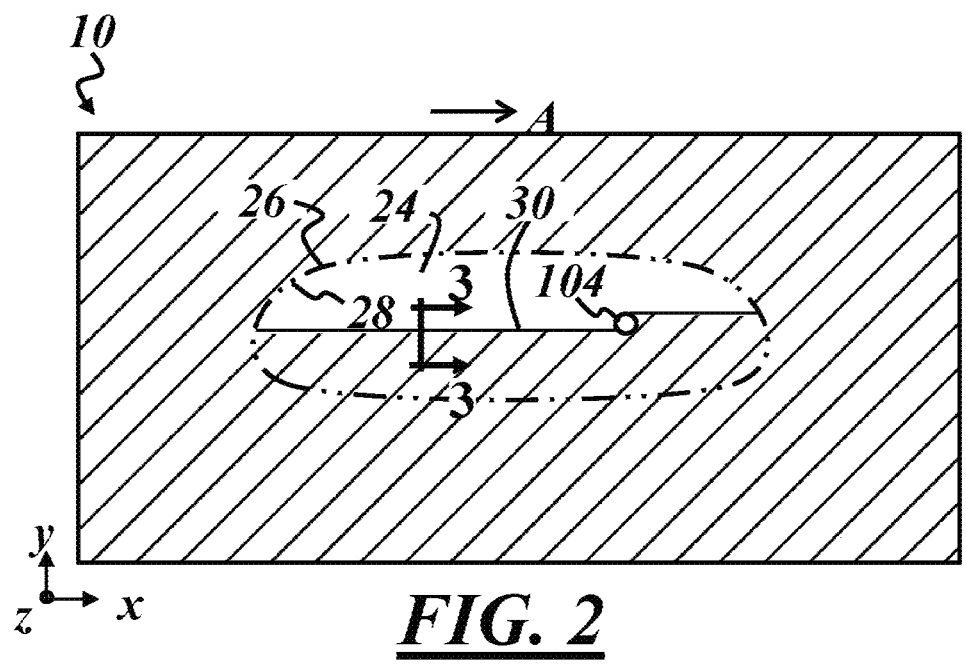
FIG. 2 is a top view of the second surface laser ablation process of FIG. 1, according to an exemplary embodiment.

In order to remove material from an area of the workpiece 10 that is larger than the laser spot 104, the laser beam 100 and/or the workpiece 10 may be moved relative to each other to remove material at a plurality of adjacent and/or overlapping laser spot locations. For instance, after the desired amount of material is removed at a first laser spot location, the workpiece 10 and/or laser beam 100 may move to define a second laser spot location for further removal of material. Continued movement to multiple adjacent and/or overlapping laser spot locations with corresponding material removal at each location defines an ablated area 24 of the workpiece 10 from which material has been removed, as shown in a top view of the process in FIG. 2, where an intended ablation area 26 is shown in phantom. In FIGS. 1 and 2, the laser beam 100 is moving in an instant process direction A with respect to the workpiece 10. One or both of the laser beam 100 or the workpiece 10 may be moved to achieve this relative movement. In one example, the laser beam 100 moves or scans back and forth in the positive and negative x-direction within the intended ablation area 26, and the laser beam 100 and/or the workpiece 10 is indexed in the y-direction each time the laser beam 100 reaches an edge 28 of the intended ablation area 26 until the coating layer 14 is removed within the entire intended ablation area 26 (e.g., a non-interleaving laser ablation process, etc.). In another example, the laser beam 100 moves or scans back and forth in the positive and negative x-direction within the intended ablation area 26 where consecutive laser spots 104 (e.g., adjacent spots, a first laser spot and a subsequent laser spot, etc.) in the x-direction are physically spaced from each other (e.g., do not overlap, etc.), and the laser beam 100 and/or the workpiece 10 is indexed in the y-direction each time the laser beam 100 reaches an edge 28 of the intended ablation area 26. The consecutive laser spots 104 (e.g., adjacent spots, a first laser spot and a subsequent laser spot, etc.) in the y-direction may also be physically spaced from each other (e.g., do not overlap, etc.). The laser beam 100 may take a plurality of passes across the entire intended ablation area 26, each of the passes at least partially offset from the previous pass such that the entire intended ablation area 26 is scanned after the plurality of passes (e.g., all of the coating layer 14 is removed from the intended ablation area 26, an interleaving laser ablation process, etc.).

A high-frequency pulsed laser may be used in conjunction with workpiece 10 and/or laser beam 100 movement at a particular rate in the process direction to determine the spacing between adjacent laser spot locations. In a non-limiting example, a laser beam operating with a pulse frequency of 400 kHz with a rate of movement with respect to the workpiece of 20 m/s in the process direction will result in laser spot locations every 50 µm in the process direction. Laser spot locations may overlap when the cross-sectional dimension of the laser beam 100, measured in the process direction, is greater than the spacing between adjacent laser spot locations (e.g., a non-interleaving laser ablation process, etc.). A single pulse or a pulse burst may be delivered at each laser spot location, where the pulse durations are generally one or more orders of magnitude less than the time between pulses. Spacing among laser spot locations may be selected so that adjacent spot locations at least partially overlap to ensure material removal between adjacent locations, particularly with non-rectangular beam cross-sections. In some embodiments, the artifacts and/or the arrangement thereof are referred to or considered as a periodic structure or periodic structures.

Figure 3:
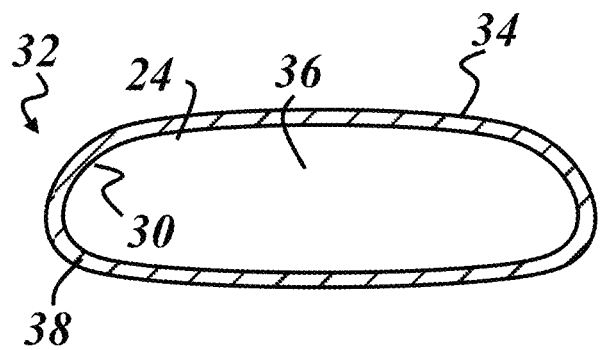
FIG. 3 is a component formed from ablated workpiece of FIG. 2, according to an exemplary embodiment.

FIG. 3 illustrates one example of a component 32 that can be formed from the ablated workpiece. Component 32 is taken from the interior of the workpiece 10 of FIG. 2 by cutting, scoring, or otherwise separating it from the surrounding portion of the ablated workpiece. In one embodiment, a series of laser induced damage channels can be formed in the substrate along a desired line of separation to facilitate removal of the component 32 from the ablated workpiece. Examples of laser induced damage channels and processes for forming them in a substrate are described in greater detail by Bareman et al. in U.S. Pat. No. 8,842,358. An edge 34 of the component 32 is formed along the line of separation. In this example, the edge 34 circumscribes the ablated area 24 formed during the ablation process and is generally parallel with the processed edge 30 of the remaining coating layer. The component 32 thus formed includes a window 36 with approximately the transparency of the substrate and a border 38 having the optical and other physical properties of the coating layer material.

The border 38, and in fact the coating layer of the original workpiece, may be formed from nearly any material (e.g., metallic, plastic and/or ceramic) and may generally be less transparent than the substrate. Certain metallic materials, such as chromium or chromium-containing materials, may be multi-functional, providing reflectivity, opacity, conductivity, along with a potentially decorative aspect. In some embodiments, the coating layer as provided to the ablation process is itself a multi-layer coating. For instance, the coating layer may include a reflective layer in direct contact with the substrate and a light-absorbing layer over the reflective layer to minimize reflection of the laser light in the ablation process. In other embodiments, some of which are described below in further detail, the workpiece may include an additional layer between the substrate and the coating layer. The additional layer may be any appropriate material. In some embodiments, the additional layer may be at least partially transparent, and may have a transparency substantially similar to the transparency of the substrate. The additional layer may conduct electricity, and in some embodiments may be formed of a transparent conductive oxide (TCO). In some embodiments, the additional layer may be a dielectric layer. In some embodiments, the additional layer may include multiple layers as part of a multi-layer stack structure. The multi-layer stack structure may include one or more layers of TCO materials, dielectric materials, insulator materials, metal materials, and/or semiconductor materials. The selection of materials for inclusion in the additional layer may be influenced by the refractive index, thickness or sequencing of the layers to achieve a desired reflectance, transmittance, and/or color in the ablated area, non-ablated area, or both. In the description below the additional layer may be referred to as a conductive layer, but it is understood that other additional layer materials described herein may be employed in place of the conductive layer. The coating layer can be selectively ablated from the TCO or dielectric layers. The coating layer may include one or more reflective layers comprising one or more metallic material, metal oxide, metal nitride or other suitable material that provides both reflectivity and opacity. In one embodiment, the workpiece includes a glass substrate, a layer of indium tin oxide (ITO) on the glass substrate, with a coating layer that includes sequential and adjacent layers of chromium (Cr), ruthenium (Ru), Cr, and Ru to form a glass/ITO/Cr/Ru/Cr/Ru material stack.

In one embodiment, the component 32 or similar component having a coating layer from which material has been laser ablated, is a mirror component, such as a component of a vehicle rearview mirror assembly. The border 38 of the component 32 may serve to eliminate the need for a separate frame for such a mirror and may also serve other functions, such as providing electrical conductivity, electrical insulation, reflectivity, and/or concealing electrical connections or other mirror assembly components. In one particular example, the component 32 is a front/outside piece and/or a rear/inside piece of an electrochromic mirror assembly (e.g., a first substrate, etc.) in which an electrochromic medium is encapsulated in a cavity formed between the back side of the component 32 (i.e., the second side 16 of the original workpiece 10 of FIG. 1) and a second similarly shaped component (e.g., a second substrate, a substrate including one or more of the same or similar features/elements as the component 32, etc.). Some examples of electrochromic mirror assemblies are also given in the above-referenced U.S. Pat. No. 8,842,358 and in some of the documents referenced therein, which are incorporated herein by reference in their entireties. Other non-mirror electrochromic devices (e.g., electrochromic windows or lenses) may also be formed from the ablated workpiece, as can non-electrochromic assemblies. In another example, the component 32 is configured to be incorporated into a dimming mirror assembly. In yet another example, the component 32 is configured to be incorporated into a chrome ring product.

Some devices that may employ at least a portion of the laser ablated workpiece, such as electrochromic devices, may require one or more electrically conductive layers such as an electrode layer. In an electrochromic device, for example, electrodes may be included on opposite sides of the electrochromic medium wherever it is desired to activate the electrochromic medium in the device. The component 32 may thus also include an electrically conductive layer along at least a portion of the window 36, corresponding to the ablated portion 24 of the original workpiece. The electrically conductive layer may be formed from a TCO or other suitable conductive material, such as ITO. In one embodiment, the conductive layer overlies the entire window 36.

Figure 4:
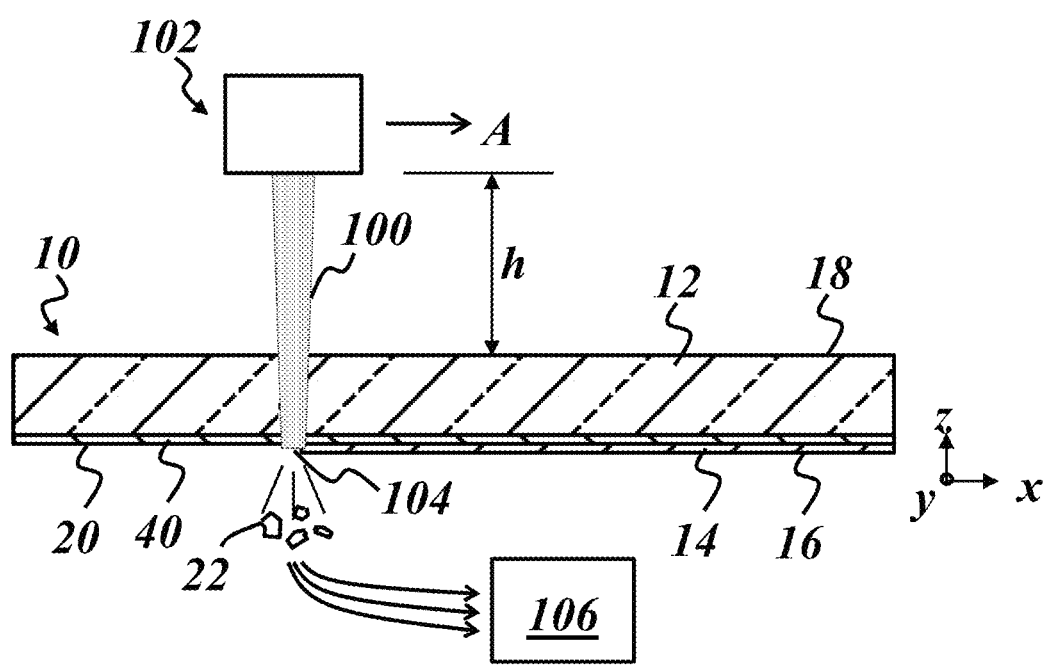
FIG. 4 is a side cross-sectional view of a second surface laser ablation process, where the workpiece includes an additional material layer, according to an exemplary embodiment.

As shown in FIG. 4, the above-described second surface laser ablation process is compatible with TCO materials or other at least partially transparent conductive layers. The materials are at least partially transparent to the wavelength of the laser employed in the laser ablation process. The workpiece 10 in the illustrated process includes an electrically conductive layer 40 at the second side 16 of the workpiece between the substrate 12 and the coating layer 14. The conductive layer 40 provides the second surface 20 from which the coating layer 14 is removed, in this example. The illustrated process represents an example of a laser ablation process in which the laser beam 100 propagates through the conductive layer 40, such as a metallic layer or TCO layer, to remove material from an opposite side of the conductive layer. In other embodiments, the electrically conductive layer may be disposed over the second side of the workpiece after the ablation process. This alternative allows for application of the conductive layer only on selected workpieces. The laser wavelength may be selected to minimize absorption by the conductive layer. In one non-limiting example, a laser having a wavelength of 532 nm is used with an ITO conductive layer in order to minimize absorption or damage to the conductive layer 40. In other embodiments, other wavelengths such as an IR laser at 1060 nm could be used.

Figure 5:
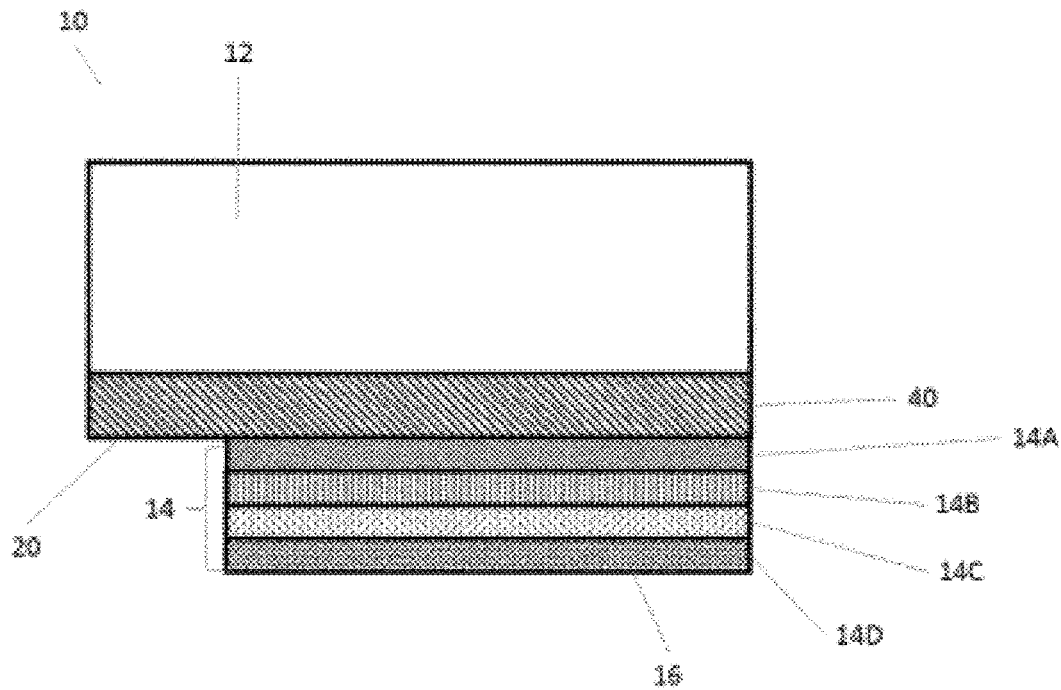
FIG. 5 is a side cross-section view of the workpiece of FIG. 4 that has been subjected to the second surface laser ablation process, where the additional material layer includes a plurality of sub-layers, according to an exemplary embodiment.

As shown in FIG. 5, the coating layer 14 may be a single layer or multi-layer. The function of each layer in the multi-layer may be selected to perform different physical, chemical or optical functions. For example, referring to FIG. 5, the coating layer 14 may be subdivided into multiple sub-layers. In some embodiments, a sub-layer 14A adjacent the conductive layer 40 may be an adhesion promoting layer, such as a layer including Cr or Ti. A second sub-layer 14B may be a reflecting layer. The reflecting layer may include a silver-gold alloy chrome, ruthenium, stainless steel, silicon, titanium, nickel, molybdenum, chromium-molybdenum-nickel alloys, nickel chromium, nickel-based alloys, Inconel, indium, palladium, osmium, cobalt, cadmium, niobium, brass, bronze, tungsten, rhenium, iridium, aluminum, aluminum alloys, scandium, yttrium, zirconium, vanadium, manganese, iron, zinc, tin, lead, bismuth, antimony, rhodium, tantalum, copper, gold, platinum, any other platinum group metals, alloys whose constituents are primarily the aforementioned materials, and combinations thereof. A third sub-layer 14C may be an opacifying layer. The opacifying layer may include nickel silicide, chrome, nickel, titanium, Monel, cobalt, platinum, indium, vanadium, stainless steel, aluminum titanium alloys, niobium, ruthenium, molybdenum tantalum alloys, aluminum silicon alloys, nickel chrome molybdenum alloys, molybdenum rhenium alloys, molybdenum, tungsten, tantalum, rhenium, alloys whose constituents are primarily the aforementioned materials, and combinations thereof. The opacifying layer may include materials with real and imaginary refractive indices being relatively large, such as oxides, nitrides, or the like. A fourth sub-layer 14D may be an electrical stabilization layer. The electrical stabilization layer may include the platinum group metals, such as Iridium, Osmium, Palladium, Platinum, Rhodium, Ruthenium, and their alloys or mixtures. Additionally, the coating layer 14 may be further sub-divided such that any sub-layer may comprise further sub-layers within themselves to meet the requirements of the stack.

The relationship between laser wavelength and energy absorption by the materials in the workpiece highlights at least one surprising result of performing laser ablation through transparent materials. It has been found that, although certain substrates and/or coatings, such as glass and ITO, are visibly transparent, they may absorb at least a portion of the energy in each laser pulse when passing therethrough. Material selection and process parameters must be selected and/or adjusted accordingly. For instance, different glass formulations may have different absorption spectra. One glass formulation may include trace elements with an absorption peak at or near the laser wavelength and thus may absorb some percentage of light passing therethrough, while another glass formulation may transmit essentially all of the incident light. The same holds true for coating layer materials. Absorption of laser energy by the substrate 12 and/or the optional coating layer 40 may be characterized by a threshold level above which the outer coating layer 14 cannot be removed without damage to the substrate and/or optional coating layer. Above this threshold, such a large portion of the laser energy is absorbed while passing through the workpiece that increasing the laser pulse energy to a level sufficient to remove the coating layer 14 while accounting for substrate and/or coating layer 40 absorption also surpasses the damage threshold for the substrate and/or coating layer 40.

It has also been found that the laser beam can be used to selectively alter one or more properties of a material layer through which it passes when the material layer has a non-zero absorption at the wavelength of the laser beam. For instance, during a second surface laser ablation process performed through a conductive layer 40, such as a layer of ITO or other TCO, one or more of the following characteristics of the layer 40 may be altered: surface roughness, electrical resistance, work function, carrier mobility and/or concentration. Further, certain characteristics may be altered by different amounts within the layer thickness, and layer thickness can be used to alter or control laser energy distribution within the overall stack of material layers. Some of these changes may be manifested in changes to final product behavior, such as when the conductive layer 40 is an electrode layer in an electrochromic device formed from the ablated workpiece.

In one example, the surface roughness of the additional layer 40 is increased at the ablated area of the workpiece relative to the surface roughness of the additional layer 40 as measured before the coating layer 14 to be ablated is applied. Increased surface roughness may have positive or negative effects, depending on the end application. For instance, increased roughness may correspond to increased surface area in some applications (i.e., more surface contact with an electrochromic (EC) medium in EC devices) or better surface wetting or adhesion in other applications. If surface roughness is sufficiently high, reduced clarity (i.e., more scattering of light) could result on a transparent substrate, which could be advantageous or detrimental, depending on the application. Performing laser ablation through a coating layer that is not removed thus represents an unconventional approach to altering surface characteristics of the unremoved coating layer.

Where the additional layer 40 is electrically conductive, the laser beam may alter the electrical resistance of the layer. Though the mechanism is not fully understood, electrical resistance can be affected in both directions. In some cases, where a sufficiently large amount of laser energy is absorbed by the conductive layer 40, the electrical resistance can increase, possibly due to some damage or breakdown within the layer. In other cases, a smaller amount of energy absorption within the conductive layer can result in lower electrical resistance.

In certain embodiments, another property of the conductive layer 40 affected by the laser beam passing therethrough is the work function of the conductive layer. This changed characteristic has been shown to manifest itself in a functioning electrochromic device made from the ablated workpiece, where the ablated area of the workpiece darkens at a higher or lower rate than unablated areas of the same workpiece.

Certain semi-conducting properties of the conductive layer may also be altered by the laser beam during the ablation process, such as carrier concentration and/or carrier mobility. For instance, these material characteristics may be selectively altered at the ablated surface either by removal of a portion of the conductive layer, or by preferentially modifying the surface properties by exposure to the laser beam.

One manner of controllably affecting these and other changes in the additional material layer 40 is via the thickness of the layer. For example, increased thickness of an additional material layer that absorbs a portion of the laser light passing therethrough increases the total amount of energy absorbed in the layer 40 and may increase the effect the laser has on the layer 40. The thickness of layer 40 may also affect the uniformity of the property change or changes. For instance, the property changes may be greater at one portion of the thickness of the layer 40 than at another portion of the thickness, and increased thickness may increase the property gradient. In another example, the thickness of the additional layer 40 can be used to affect the distribution of laser energy in other layers of the workpiece. For instance, a self-focusing effect may occur within the layer 40, and the thickness of the layer may affect where the electric field is concentrated within the multiple layers of materials.

One manner of optimizing the laser ablation process is to maximize the removal rate of the coating layer 14 by maximizing the cross-sectional size of the laser beam 100 and the associated laser spot 104 (e.g., via selection of laser optics), along with the speed at which the laser is rastered along the workpiece 10. This optimization is limited by the flux at the second surface 20 being reduced as the square of the beam radius at the surface. Above a threshold spot size, the energy flux falls below the ablation threshold for the coating layer, resulting in a net loss of performance. It is thus useful to configure the laser spot size and raster speed to just above the ablation threshold to reduce the process cycle time. A large spot size improves overall coating removal rate, but it may limit the size scale on which indicia can be formed, in the absence of masking. For example, if a 200 micron diameter laser spot size is used to rapidly remove the coating layer, smooth and/or fine features on a 50 or 100 micron scale cannot be formed, whether part of indicia or other features, due both to the overall size of the spot and its round shape. Employing a non-circular beam (e.g., rectangular) can help eliminate the above-described scalloped shape of the processed edge and reduced the amount of overlap required by adjacent laser spot locations. But formation of features smaller than the laser spot is problematic, even with shaped beams. Some processes employ a second, smaller beam to form the small features while using a larger optimized beam to remove the bulk of the coating layer material.

Picosecond lasers are configured to deliver the energy necessary for coating material removal in laser pulses with durations in a range from about 0.5 to about 500 picosends (ps). Pulse durations of several tens of picoseconds may be preferred, such as 1-50 ps or 50 ps or less. Commercially available picosecond lasers can provide pulse durations of less than 20 ps, less than 10 ps, less than 5 ps, or less than 1 ps, to name a few. Femtosecond lasers having a pulse duration in a range from about 0.5 to about 500 femtoseconds (fs) can provide some of the same advantages as picosecond lasers when compared with nanosecond lasers (0.5 to 500 ns pulse duration).

The various advantages of the interleaving laser ablation process relative to the non-interleaving laser ablation process is described in more detail herein with reference to FIGS. 7A-7E (e.g., indicative of non-interleaving, etc.) and FIGS. 8A-8E (e.g., indicative of interleaving, etc.).

With further reference to FIG. 4, experiments have been conducted to quantify changes to the conductive layer 40 when the laser beam passes through the conductive layer during an ablation process that removes coating layer 14 material from the workpiece 10. In these experiments, the conductive layer 40 is ITO deposited on a sodalime float glass substrate 12 having a thickness of 1.6 mm. ITO thickness was varied from workpiece to workpiece as a controlled variable. The coating layer 14 is chromium deposited on the ITO and having a thickness, such as approximately 50 nm, sufficient to arrive at visible light transmittance of approximately 0.4%. The laser ablation was performed using a picosecond laser.

As noted above, results of the ablation process depend on several parameters, including laser spot size, pulse energy, pulse width (i.e., pulse duration), laser wavelength, and/or spot-to-spot distance D. Each layer, and in particular the coating layer 14, has an absorbed energy threshold at and above which physical removal of the layer will occur due to breaking of bonds (i.e., intermolecular, intramolecular, adhesive, etc.). The absorbance of each material in the workpiece 10, and thus the amount of energy absorbed at each location within the thickness of the workpiece, is a function of the wavelength of the laser light.

Absorbance also depends on the local intensity of the laser light. While this dependence can often be ignored, the relatively high peak pulse power delivered by ultra-short pulse lasers, such as picosecond, femtosecond, and certain nanosecond lasers, make this intensity-dependence relevant and sometimes dominant. Therefore, pulse width (i.e., pulse duration) is a relevant process parameter, especially in processes employing ultra-short pulse lasers. Pulse width also influences the dynamics of the energy absorption by the coating layer during the ablation process. For instance, relatively longer pulses may lead to heat dissipation in the coating layer material adjacent to and outside of the laser spot and can have the effect of reducing the temperature reached within the laser spot and/or can have the effect of damaging or otherwise affecting coating layer material outside of the laser spot. Material outside of the laser spot that is affected due to heat absorbed during the ablation process defines a heat-affected zone (HAZ) of the coating layer. Generally, a smaller laser pulse width leads to a smaller HAZ. Ablated material takes absorbed heat with it and potentially helps reduce the size of the HAZ in the unremoved coating layer material.

Referring now to FIGS. 6-8E, (i) a first surface profile formed using a non-interleaving laser ablation process and the characteristics thereof (e.g., diffracted light patterns, amount of light diffraction, peak-to-valley height, surface profile, etc.) and (ii) a second surface profile formed using an interleaving laser ablation process and the characteristics thereof (e.g., diffracted light patterns, amount of light diffraction, peak-to-valley height, surface profile, etc.) are shown, according to an exemplary embodiment. According to an exemplary embodiment, the interleaving laser ablation process provides various advantages relative to the non-interleaving laser ablation process. By way of example, the interleaving laser ablation process may advantageously reduce levels of light diffraction of the laser ablated surface, reduce damage to the laser ablated surface (e.g., the conductive layer 40, ITO, the second surface 20, etc.), reduce peak-to-valley height in the surface profile of the laser ablated surface (e.g., in the conductive layer 40, the ITO, the second surface 20, etc.), provide higher conductivity coatings, provide pattern reduction (e.g., a more random pattern on the surface profile, a less repeating pattern, reduce periodicity, etc.), provide increased heat dissipation to reduce the size of the HAZ, facilitate more efficient (e.g., easier and/or quicker, etc.) detachment or removal of the coating layer 14 at each laser spot, and/or still other advantages relative to the non-interleaving laser ablation process. In some embodiments, the interleaving laser ablation process is performed without increasing the time required to perform the laser ablation process (e.g., the difference in time between the interleaving laser ablation process and the non-interleaving laser ablation process is nominal, etc.). In other embodiments, the interleaving laser ablation process is performed in less time or more time relative to a non-interleaving laser ablation process (e.g., based on the chosen spacing between laser pulses, the number of scan passes, etc. of the interleaving laser ablation process).

Figure 6:
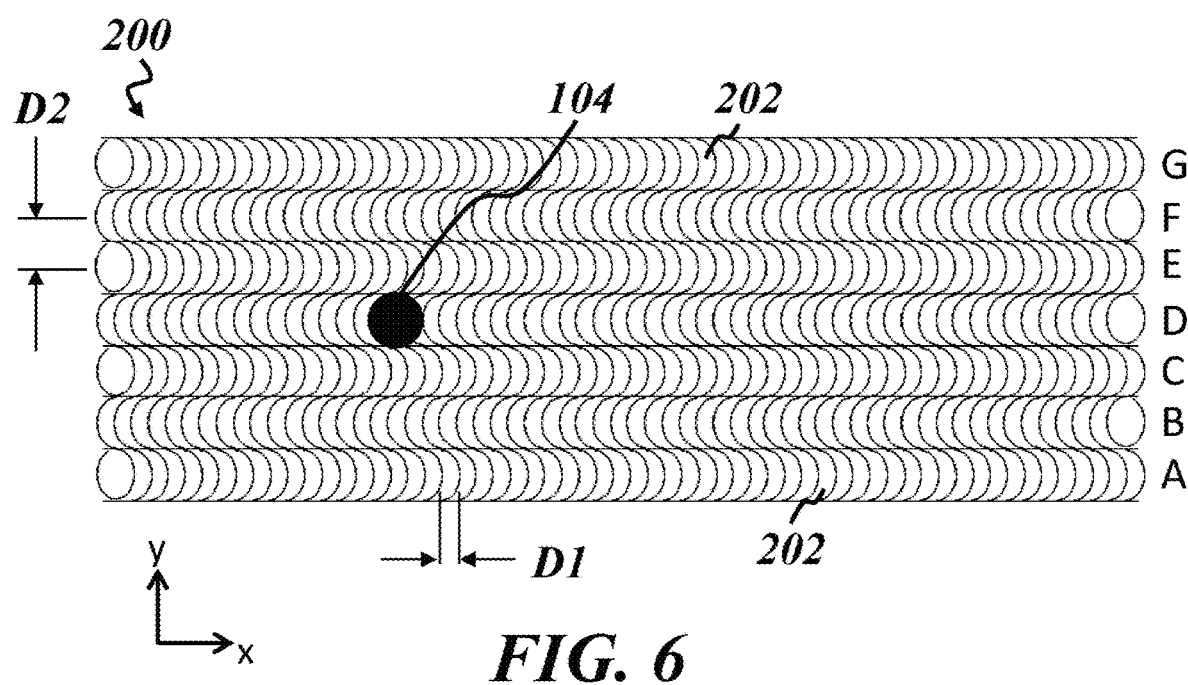
FIG. 6 is a schematic view of a non-interleaved laser ablated surface, according to an exemplary embodiment.
Figure 7A:
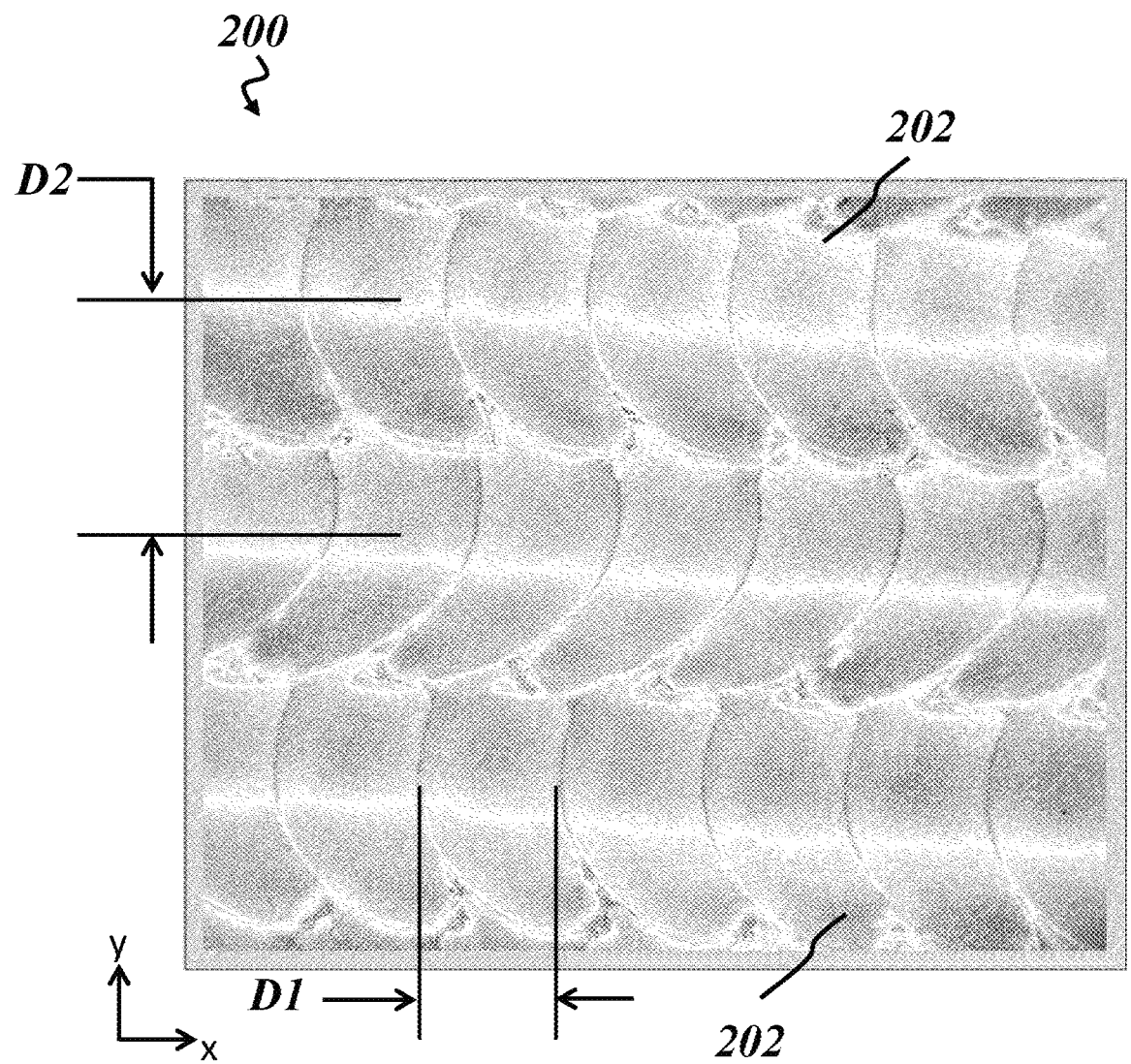
FIG. 7A is a detailed schematic view of a non-interleaved laser ablated surface, according to an exemplary embodiment.

Referring to FIGS. 6 and 7A, an example of a surface, shown as non-interleaved surface profile 200, of a workpiece after coating material (e.g., the coating layer 14, etc.) has been removed from the workpiece (e.g., from the second side 20, the conductive layer 40, the ITO, etc.) by a non-interleaving laser ablation process is shown, according to an exemplary embodiment. As shown in FIGS. 6 and 7A, the non-interleaved surface profile 200 has a plurality of laser spots, shown as laser spots 202. In FIGS. 6 and 7A, spacing D1 represents the spacing between adjacent laser spots 202 in the x-direction (i.e., the process direction), and spacing D2 represents the spacing between adjacent rows (e.g., rows A-G, etc.) of laser spots 202 in the y-direction (i.e., the transverse direction). The location of an arbitrary single laser spot 104 is darkened in row D for illustrative purposes. The shape of each laser spot 202 is generally circular. Depending on the manner of laser beam/substrate movement in the process direction, a circular laser beam may form elliptical laser spots 202. In this particular example, the diameter of the laser spots 202 is approximately the same as the spacing D2 between rows, and the spacing D1 between laser spots in the process direction is approximately ⅓ the diameter of the laser spots 202. In other embodiments, spacing D2 is less than the diameter of the laser spots 202 and spacing D1 is greater than ⅓ the diameter of the laser spots 202, but less than the diameter of the laser spots 202. Therefore, consecutive laser spots 202 and adjacent rows may be overlapping and/or touching when using a non-interleaving laser ablation process. Also in this example, the process direction of one row is opposite from the process direction of an adjacent row (e.g., a serpentine pattern, etc.). In particular, the process direction of row A of FIG. 6 is from left-to-right, row B is right-to-left, row C is left-to-right, etc. Thus, the non-interleaving laser ablation process includes a single pass of the laser beam that serpentines across the entire workpiece, removing all of the coating material which thereby provides the non-interleaved surface profile 200 shown in FIGS. 6 and 7A.

Spot size, shape, and/or overlap in the x-direction and/or the y-direction may be different than illustrated in FIGS. 6 and 7A. But for a non-interleaving laser ablation process, the resultant surface profile of the workpiece has a regular or uniform pattern of laser spots. In some instances, such a regular pattern of laser spots may lead to undesirable visual effects at the ablated surface (e.g., the conductive layer 40, ITO, the second surface 20, etc.), as is described in more detail herein.

Figure 7B:
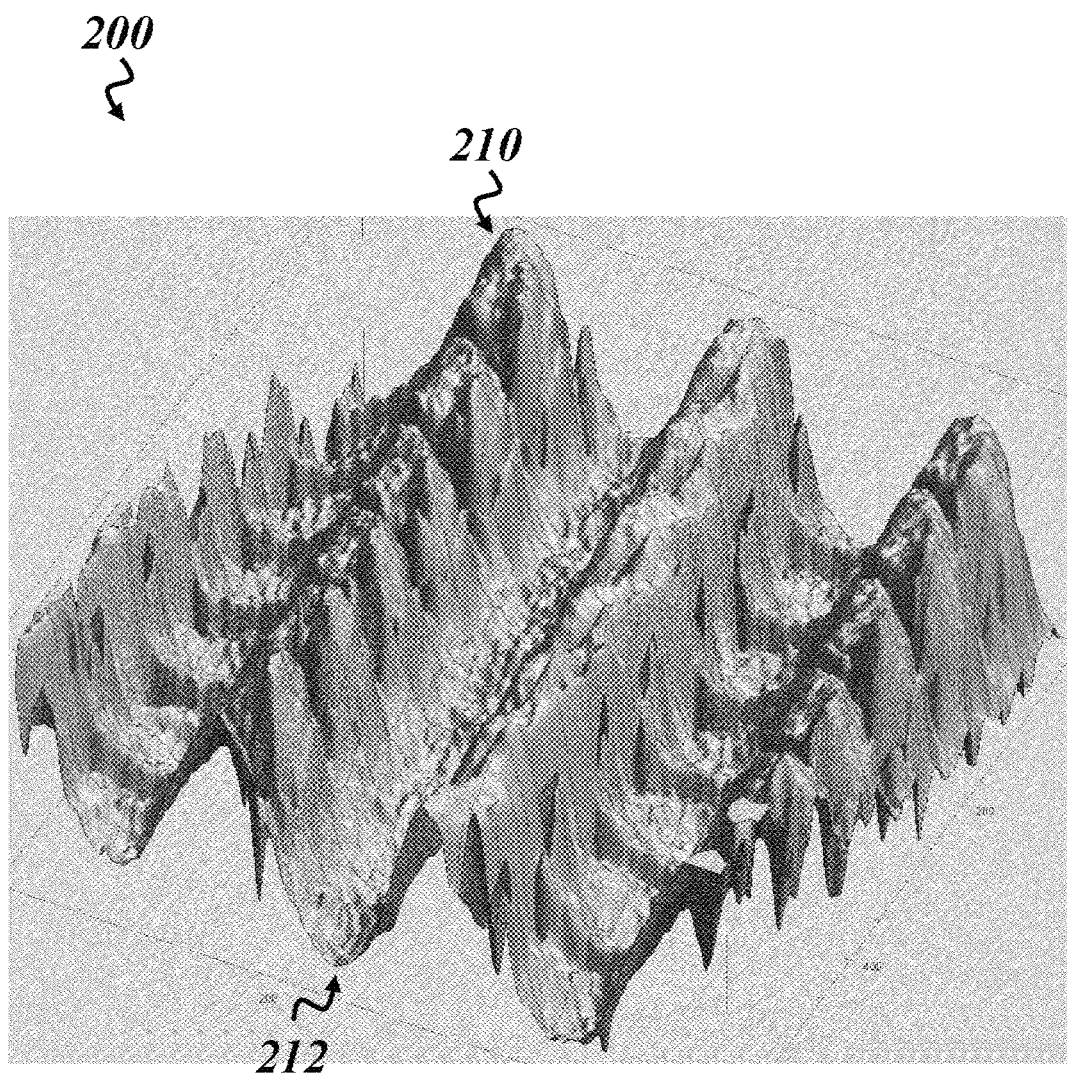
FIG. 7B is a white-light interferometer measured three-dimensional perspective surface profile of the non-interleaved laser ablated surface of FIG. 7A, according to an exemplary embodiment.
Figure 7C:
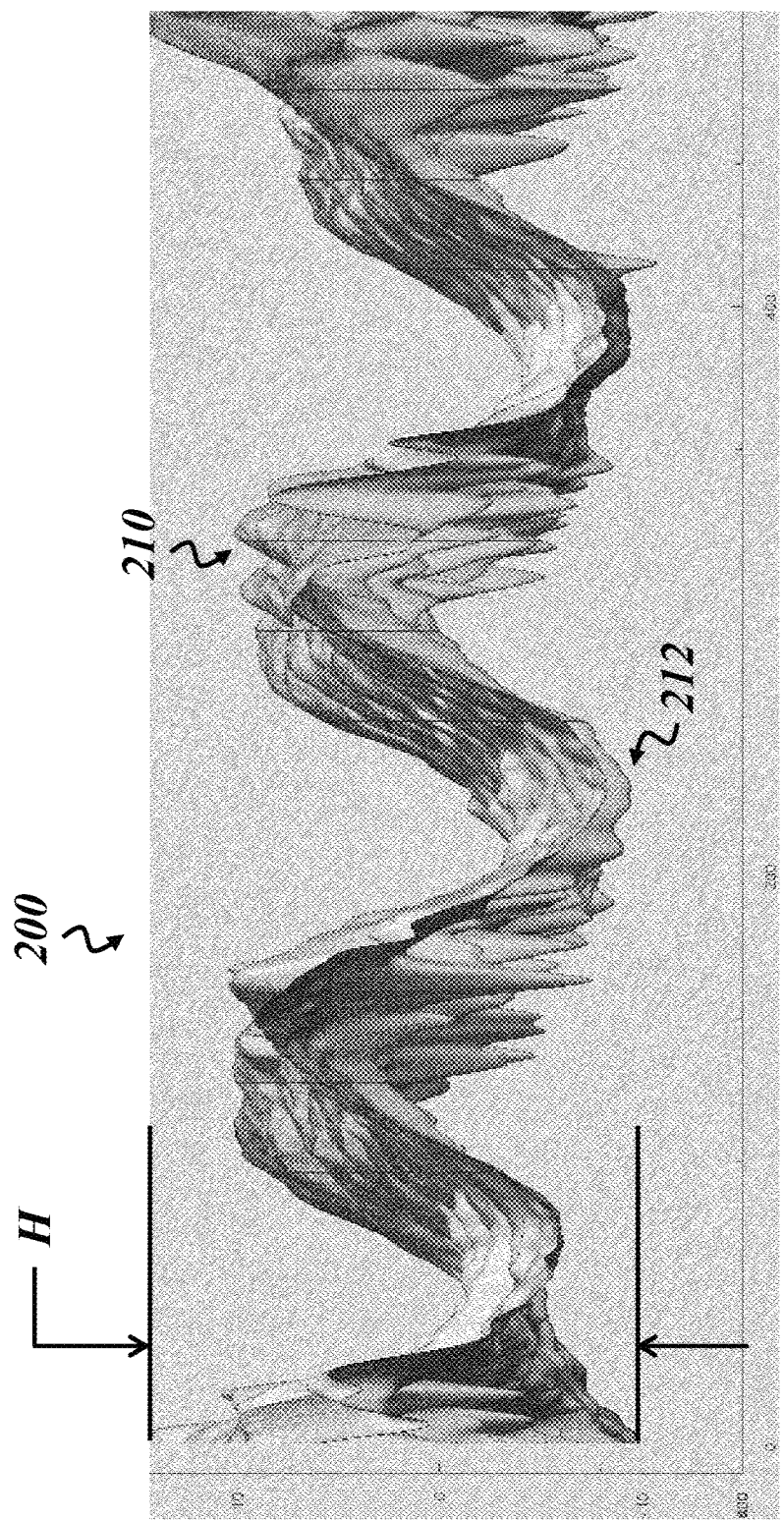
FIG. 7C is a white-light interferometer measured three-dimensional cross-sectional surface profile of the non-interleaved laser ablated surface of FIG. 7A, according to an exemplary embodiment.

Referring to FIGS. 7B and 7C, three-dimensional depictions of the non-interleaved surface profile 200 are shown (e.g., measured using a white light interferometer, etc.), according to an exemplary embodiment. As shown in FIGS. 7B and 7C, the non-interleaved surface profile 200 has a regular, uniform, periodic shape (e.g., non-random; has a discernible, repeating pattern; the non-interleaved surface profile 200 has sinusoidal characteristics, a wave structure, etc.). The non-interleaved surface profile 200 has a plurality of peaks, shown as peaks 210, and a plurality of valleys, shown as valleys 212. An amplitude of each of the peaks 210 and each of the valleys 212 defines a height H (e.g., a peak-to-valley dimension, etc.) of the non-interleaved surface profile 200. As shown in FIG. 7C, the height H of the non-interleaved surface profile 200 is approximately between 20 nm and 25 nm.

Figure 7D:
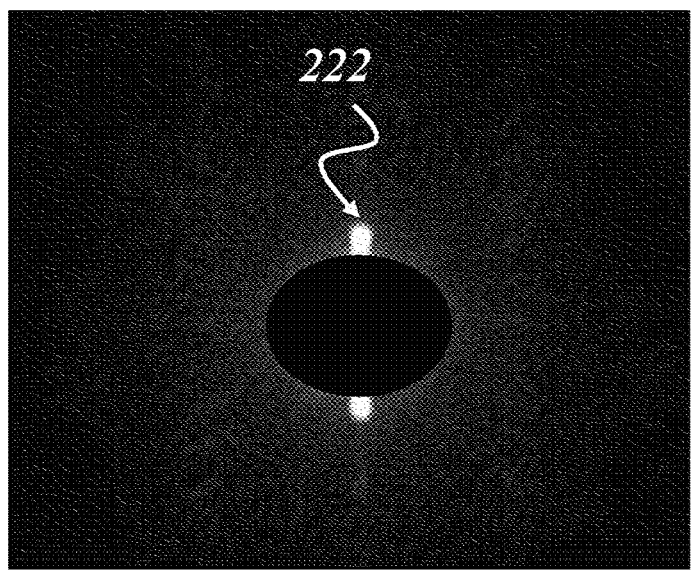
FIG. 7D is a diffracted light pattern for the non-interleaved laser ablated surface of FIG. 7A, according to an exemplary embodiment.

Referring to FIG. 7D, a diffracted light pattern 220 for the non-interleaved surface profile 200 is shown, according to an exemplary embodiment. As shown in FIG. 7D, the diffracted light pattern 220 for the non-interleaved surface profile 200 (e.g., measured using a vision system, etc.) includes a plurality of high-intensity dots, shown as dots 222. According to an exemplary embodiment, the dots 222 indicate light that is being diffracted by the non-interleaved surface profile 200. More particularly, the dots 222 of the diffracted light pattern 220 indicate the amount of light that is diffracted by the non-interleaved surface profile 200 as a function of angle. The brightness and/or color of the dots 222 (e.g., intensity, clarity, whiteness, etc.) may indicate an amount of light diffracted by the non-interleaved surface profile 200 for a particular angle (e.g., a brighter, more intense, and/or more white dot 222 indicates a relatively greater amount of light diffraction, etc.).

Figure 7E:
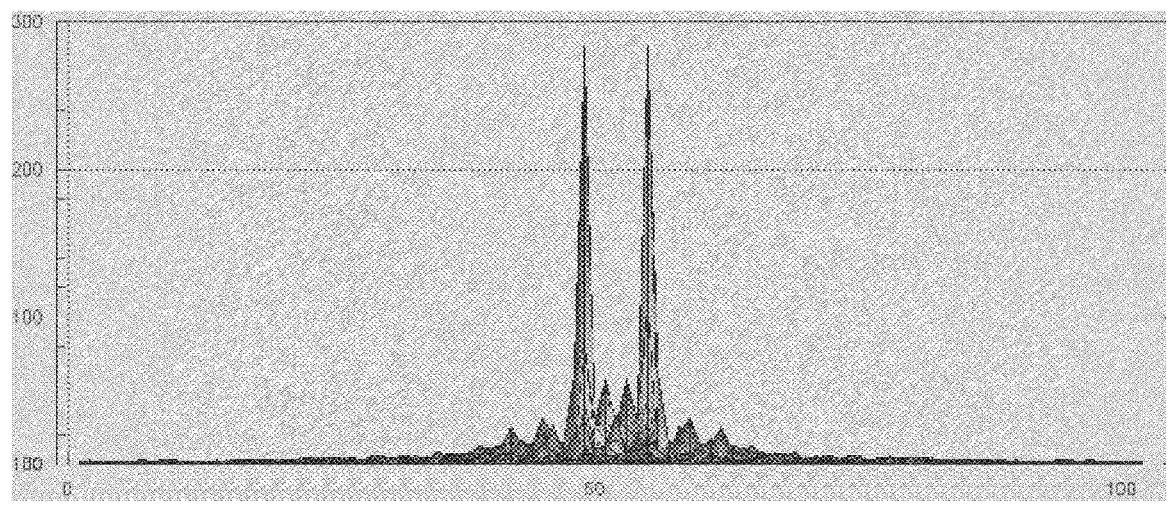
FIG. 7E is a three-dimensional cross-sectional plot of the Fourier transform of the non-interleaved surface profile of FIG. 7B, according to an exemplary embodiment.

Referring to FIG. 7E, a three-dimensional cross-sectional plot 230 of the Fourier transform of the interleaved surface profile 200 of FIG. 7B, is shown according to an exemplary embodiment. By way of example, three-dimensional cross-sectional plot 230 may be generated by measuring the surface profile of the interleaved surface profile 200 of FIG. 7B and then taking the Fourier transform of the measured surface profile. As shown in FIG. 7E, the three-dimensional cross-sectional plot 230 graphically depicts the diffraction pattern for the non-interleaved surface profile 200 which has a maximum value of approximately 250-300 inverse nanometers.

Figure 8A:
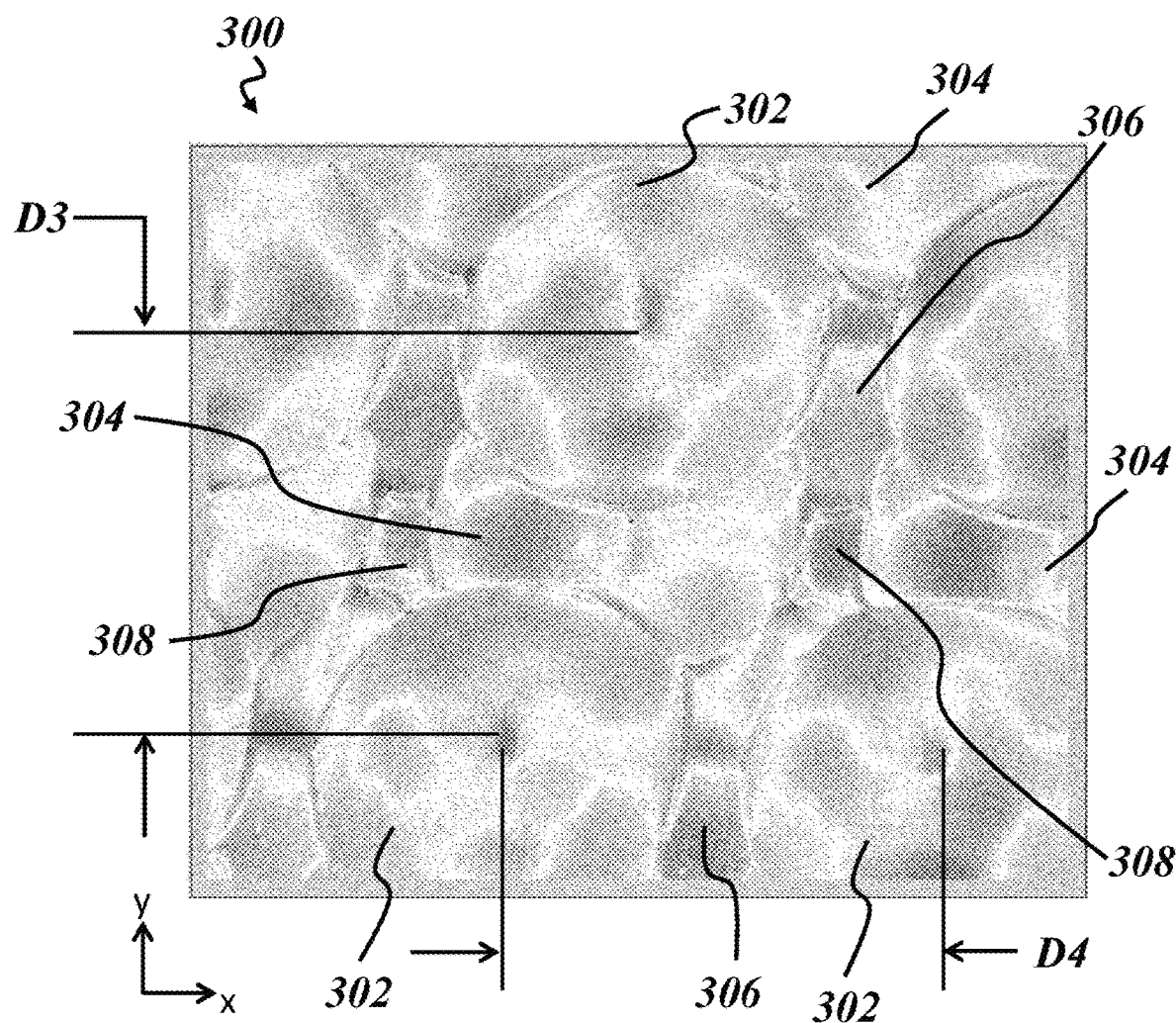
FIG. 8A is detailed a schematic view of an interleaved laser ablated surface, according to an exemplary embodiment.

Referring now to FIG. 8A, an example of a surface, shown as interleaved surface profile 300, of a workpiece after coating material (e.g., the coating layer 14, etc.) has been removed from the workpiece (e.g., from the second side 20, the conductive layer 40, the ITO, etc.) by an interleaving laser ablation process is shown, according to an exemplary embodiment. As shown in FIG. 8A, the interleaved surface profile 300 has a plurality of laser spots, shown as first laser spots 302, second laser spots 304, third laser spots 306, and fourth laser spots 308. According to an exemplary embodiment, the first laser spots 302 are associated with a first laser ablation pass of the laser beam 100, the second laser spots 304 are associated with a second pass of the laser beam 100, the third laser spots 306 are associated with a third pass of the laser beam 100, and the fourth laser spots are associated with a fourth pass of the laser beam 100. By way of example, each of the first pass, the second pass, the third pass, and the fourth pass of the laser source 102 may travel along substantially the entire workpiece, but only provide pulses of the laser beam 100 at desired, discrete locations. In other embodiments, the interleaved surface profile 300 is provided using more or fewer passes (e.g., three, five, etc.). The order of the first, second, third, and fourth passes of the laser beam may be varied according to various other exemplary embodiments, along with various characteristics of the laser ablation (e.g., the pulse duration, sweep speed, etc.). The passes of the laser beam may be made in any direction along the workpiece (e.g., in the X-Y direction, diagonally, or in any other suitable direction or pattern). According to still other exemplary embodiments, the individual pulses associated with each of the laser spot types (e.g., the first, second, third, and fourth laser spots) may be randomly applied over the desired area of the surface in any desired manner.

In FIG. 8A, spacing D3 represents the spacing between the center of (i) adjacent rows of first laser spots 302, (ii) adjacent rows of second laser spots 304, (iii) adjacent rows of third laser spots 306, and/or (iv) adjacent rows of fourth laser spots 308 in the y-direction (i.e., the transverse direction), and spacing D4 represents the spacing between the center of (i) adjacent first laser spots 302, (ii) adjacent second laser spots 304, (iii) adjacent third laser spots 306, and/or (iv) adjacent fourth laser spots 308 in the x-direction (i.e., the process direction). According to an exemplary embodiment, spacing D3 and/or spacing D4 are greater than or equal to the diameter of the first laser spots 302, the second laser spots 304, the third laser spots 306, and the fourth laser spots 308 such that (i) adjacent first laser spots 302 do not overlap, (ii) adjacent second laser spots 304 do not overlap, (iii) adjacent third laser spots 306 do not overlap, and (iv) adjacent fourth laser spots 308 do not overlap. Spacing D3 and/or spacing D4 may range from anywhere between being equal to the diameter of the laser spots to being more than twice the diameter of the laser spots (e.g., one, one and a quarter, one and a third, one and a half, one and two-thirds, one and three-quarters, two, two and a quarter, two and a third, two and a half, etc. times the diameter of the laser spots). In one embodiment, spacing D3 and spacing D4 are the same. In other embodiments, spacing D3 and spacing D4 are different. In some embodiments, the first laser spots 302, the second laser spots 304, the third laser spots 306, and the fourth laser spots 308 have the same diameter. In some embodiments, at least one of the first laser spots 302, the second laser spots 304, the third laser spots 306, and the fourth laser spots 308 have a different diameter than the others.

As shown in FIG. 8A, a first laser spot 302 may overlap one or more adjacent laser spots that are not a first laser spot 302. By way of example, a first laser spot 302 may overlap with a second laser spot 304, a third laser spot 306, and/or a fourth laser spot 308. Therefore, adjacent laser spots (e.g., consecutive laser spots, etc.) and/or adjacent rows of laser spots of a respective laser ablation pass (e.g., first laser spots 302 of a first laser ablation pass, etc.) may not touch and/or overlap when using an interleaving laser ablation process, but laser spots of different laser ablation passes may overlap (e.g., a first laser spot 302 overlaps a second laser spot 304, etc.). By way of example, each subsequent laser ablation pass may at least partially overlap the laser spots created by the previous laser ablation passes, thereby removing a lesser amount of coating layer 14 than the preceding laser ablation pass until a desired amount of the coating layer 14 is removed (e.g., the first laser spots 302 remove the most material and the fourth laser spots 308 remove the least material, the first laser spots 302 appear the largest and the fourth laser spots 308 appear the smallest, while the diameter of the laser beam 100 may remain constant, etc.).

According to an exemplary embodiment, physically spacing the laser spots of a respective laser ablation pass (e.g., the first laser spots 302 of the first laser ablation pass, etc.) and temporally spacing overlapping laser spots of consecutive laser ablation passes relative to each other (e.g., a first laser spot of a first laser ablation pass relative to an overlapping second laser spot of a second laser ablation pass, etc.) may provide various advantageous surface characteristics of the interleaved surface profile 300 relative to the non-interleaved surface profile 200. According to an exemplary embodiment, such physical and temporal spacing of the interleaving laser ablation process increases heat dissipation within the workpiece. Such an increase in heat dissipation may minimize the HAZ which may reduce damage to the ablated surface (e.g., the conductive layer 40, the ITO, etc.) which thereby reduces levels of light diffraction of the laser ablated surface, as well as may facilitate removing the coating material with greater ease and more efficiently.

According to an exemplary embodiment, the laser ablated surface having the interleaved surface profile 300 is formed by subjecting the conductive layer 40 to an interleaving laser ablation process that includes non-overlapped laser spots and overlapped laser spots. A laser spot in general can refer to an area of a workpiece that has been modified by an incident laser beam or pulse. The laser spot may remain visible after the process is finished by the surface structure on the workpiece. An interleaving laser ablation process may provide two types of laser spots, referred to herein as non-overlapped laser spots and overlapped laser spots.

As use herein, a "non-overlapped laser spot" refers to a laser spot resulting from a laser pulse incident on an area of the coating layer 14 that has not yet at least partially been removed by one or more previous pulses. Therefore, the shape of the non-overlapped laser spot is a result of the parameters of the laser beam and the coating, including, but not limited to: beam size, beam shape, pulse energy, pulse length, wavelength, coating material properties, conductive material properties, and/or substrate material properties. In general, the shape of the non-overlapped laser spots will be substantially circular-shaped, square-shaped, rectangular-shaped, elliptical-shaped, etc. based on primarily the shape of the laser beam. In FIG. 8A, the first laser spots 302 are non-overlapped laser spots.

As use herein, an "overlapped laser spot" refers to a laser spot resulting from a laser pulse incident on an area of the coating layer 14 that has been at least partially removed by one or more previous pulses. Therefore, the shape of the overlapped laser spot is a result of the parameters of the laser beam, the coating, and the relative location and shape of previous laser spots. In general, the shape of the overlapped laser spots may not be a simple or standard shape like a circle, a square, a rectangle, or an ellipse. The overlapped laser spots may have a shape based on the shape of the laser beam and an amount of overlap of the laser beam with one or more previously generated non-overlapped and/or overlapped laser spots. In FIG. 8A, the second laser spots 306, the third laser spots 304, and the fourth laser spots 308 are overlapped laser spots and exhibit a variety of shapes.

The overlapped laser spots may thereby have a lesser effective area than the non-overlapped laser spots (i.e., the laser pulses remove less area of the coating layer 14 when forming the overlapped laser spots relative to when forming the non-overlapped laser spots). In some embodiments, the beam size, beam shape, pulse energy, pulse length, and/or wavelength of the laser pulses creating the non-overlapped laser spots may be different than those of the laser pulses creating the overlapped laser spots.

In some embodiments, the non-overlapped laser spots of the interleaving laser ablation process comprise an area on the conductive layer 40 that is greater than 1% of the total surface area of the conductive layer 40 (e.g., the non-overlapped laser spots cover greater than 1% of a total surface area of the laser ablated surface, the laser pulses forming the non-overlapped laser spots remove a portion of the coating layer 14 greater than 1% of a total surface area of the laser ablated surface, etc.). In some embodiments, the non-overlapped laser spots of the interleaving laser ablation process comprise an area on the conductive layer 40 that is greater than 10% of the total surface area of the conductive layer 40 (e.g., the non-overlapped laser spots cover greater than 10% of a total surface area of the laser ablated surface, the laser pulses forming the non-overlapped laser spots remove a portion of the coating layer 14 greater than 10% of a total surface area of the laser ablated surface, etc.). In some embodiments, the non-overlapped laser spots of the interleaving laser ablation process comprise an area on the conductive layer 40 that is greater than 25% of the total surface area of the conductive layer 40 (e.g., the non-overlapped laser spots cover greater than 25% of a total surface area of the laser ablated surface, the laser pulses forming the non-overlapped laser spots remove a portion of the coating layer 14 greater than 25% of a total surface area of the laser ablated surface, etc.). In some embodiments, the non-overlapped laser spots of the interleaving laser ablation process comprise an area on the conductive layer 40 that is greater than 50% of the total surface area of the conductive layer 40 (e.g., the non-overlapped laser spots cover greater than 50% of a total surface area of the laser ablated surface, the laser pulses forming the non-overlapped laser spots remove a portion of the coating layer 14 greater than 50% of a total surface area of the laser ablated surface, etc.). In some embodiments, the non-overlapped laser spots of the interleaving laser ablation process comprise an area on the conductive layer 40 anywhere between 1% and 80% of the total surface area of the conductive layer 40 (e.g., 1%, 5%, 10%, 15%, 20%, 25%, 30%, 35%, 40%, 45%, 50%, 55%, 60%, 65%, 70%, 75%, 78.5%, 80%, etc.). In some embodiments, the non-overlapped laser spots of the interleaving laser ablation process comprise an area on the conductive layer 40 that is greater than 80% of the total surface area of the conductive layer 40 (e.g., the laser pulses forming the non-overlapped laser spots remove a portion of the coating layer 14 greater than 80% of a total surface area of the laser ablated surface, etc.).

Figure 8B:
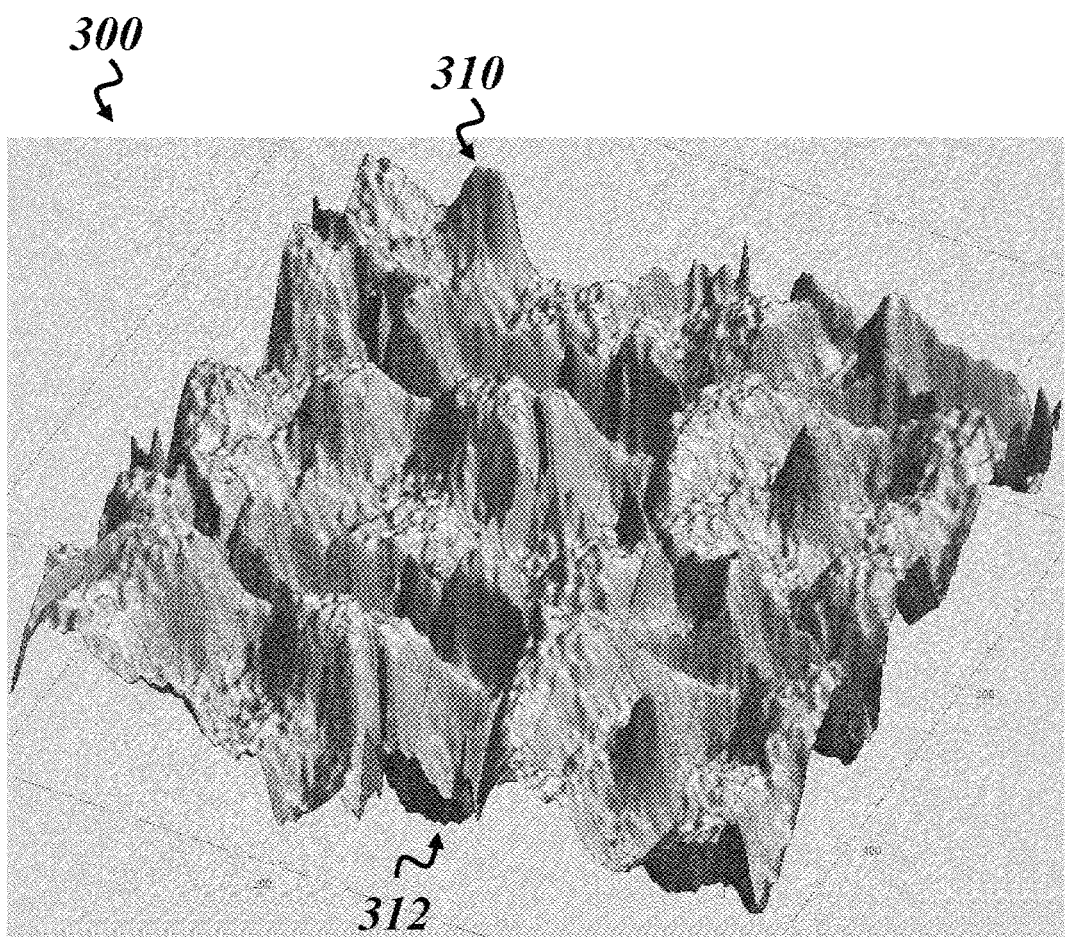
FIG. 8B is a white-light interferometer measured three-dimensional perspective surface profile of the interleaved laser ablated surface of FIG. 8A, according to an exemplary embodiment.
Figure 8C:
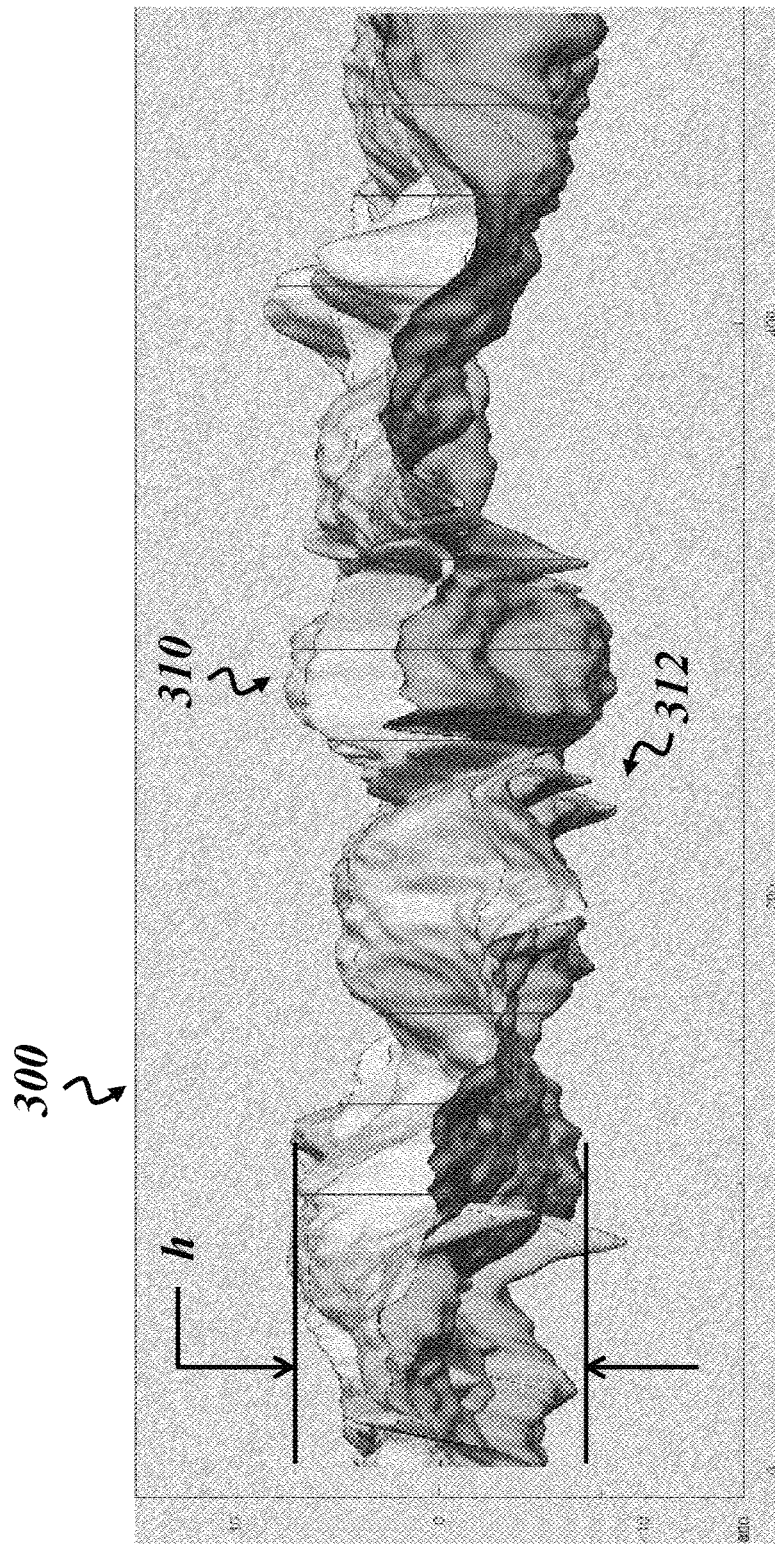
FIG. 8C is a white-light interferometer measured three-dimensional cross-sectional surface profile of the interleaved laser ablated surface of FIG. 8A, according to an exemplary embodiment.

Referring to FIGS. 8B and 8C, three-dimensional depictions of the interleaved surface profile 300 are shown (e.g., measured using a white light interferometer, etc.), according to an exemplary embodiment. As shown in FIGS. 8B and 8C, the interleaved surface profile 300 has a non-regular, non-uniform, non-constant, and/or less-repeating pattern (e.g., has a semi-random profile, has a low frequency repeating pattern, non-sinusoidal, has a non-periodic or less periodic structure, does not have a wave structure, etc.) relative to the non-interleaved surface profile 200. However, the interleaved surface profile 300 may still have a periodic nature, yet still relatively and/or substantially less periodic than the non-interleaved surface profile 200. The interleaved surface profile 300 thereby does not have the wave structure that the non-interleaved surface profile 200 has. The interleaved surface profile 300 has a plurality of peaks, shown as peaks 310, and a plurality of valleys, shown as valleys 312. An amplitude of each of the peaks 310 and each of the valleys 312 defines a height h (e.g., a peak-to-valley dimension, etc.) of the interleaved surface profile 300. As shown in FIG. 8C, the height h of the interleaved surface profile 300 is approximately between 10 nm and 20 nm. Therefore, the height h of the interleaved surface profile 300 is less than the height H of the non-interleaved surface profile 200 (e.g., between a 1% and a 60% reduction in the amplitude relative to the non-interleaved surface profile 200, etc.).

Figure 8D:
FIG. 8D is a diffracted light pattern for the interleaved laser ablated surface of FIG. 8A, according to an exemplary embodiment.

Referring to FIG. 8D, a diffracted light pattern 320 for the interleaved surface profile 300 is shown, according to an exemplary embodiment. As shown in FIG. 8D, the diffracted light pattern 320 for the non-interleaved surface profile 300 (e.g., measured using a vision system, etc.) includes a plurality of low-intensity dots, shown as dots 322. According to an exemplary embodiment, the dots 322 indicate light that is being diffracted by the interleaved surface profile 300. More particularly, the dots 322 of the diffracted light pattern 320 indicate the amount of light that is diffracted by the interleaved surface profile 300 as a function of angle. The brightness and/or color of the dots 322 (e.g., intensity, clarity, whiteness, etc.) may indicate an amount of light diffracted by the interleaved surface profile 300 for a particular angle (e.g., a brighter, more intense, and/or more white dot 322 indicates a relatively greater amount of light diffraction, etc.). As shown in FIGS. 7D and 8D, the dots 322 of the diffracted light pattern 320 are more spread out and less bright than the dots 222 of the diffracted light pattern 220 (e.g., indicating lower intensity light diffraction, etc.).

Figure 8E:
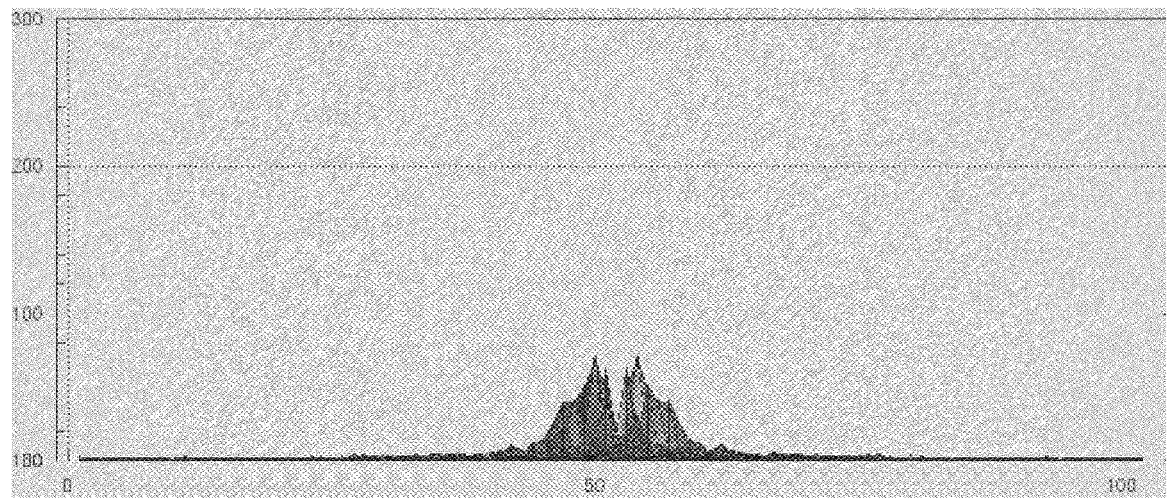
FIG. 8E is a three-dimensional cross-sectional plot of the Fourier transform of the interleaved surface profile of FIG. 8B, according to an exemplary embodiment.

Referring to FIG. 8E, a three-dimensional cross-sectional plot 330 of the Fourier transform of the non-interleaved surface profile 300 of FIG. 8B, is shown according to an exemplary embodiment. By way of example, three-dimensional cross-sectional plot 330 may be generated by measuring the surface profile of the non-interleaved surface profile 300 of FIG. 8B and then taking the Fourier transform of the measured surface profile. As shown in FIG. 8E, the three-dimensional cross-sectional plot 330 graphically depicts the diffraction pattern for the interleaved surface profile 300 which has a maximum value of approximately 50-80 inverse nanometers.

According to an exemplary embodiment, the interleaved surface profile 300 provides an improved laser ablated surface that provides improved light diffraction characteristics relative to the non-interleaved surface profile 200. By way of example, the light diffraction characteristics of the interleaved surface profile 300 may be better or less objectionable than the light diffraction characteristics of the non-interleaved surface profile 200 due to the interleaved surface profile 300 at least one of (i) reducing the total amount of light diffracted by the laser ablated surface and (ii) reducing the peak intensity of the light diffracted by the laser ablated surface (e.g., by spreading out the diffracted light, by reducing the amount of light diffracted at any particular angle, etc.).

According to an exemplary embodiment, the amount of light diffracted is related to the peak-to-valley distance of the profile of the laser ablated surface (e.g., the height H of the non-interleaved surface profile 200, the height h of the interleaved surface profile 300, etc.). Therefore, by comparing the height H and the height h, the amount of light diffracted by the interleaved surface profile 300 may be less than the amount of light diffracted by the non-interleaved surface profile 200 (e.g., between a 200% and a 500% reduction in the light diffraction relative to the non-interleaved surface profile 200, since the height h of the interleaved surface profile 300 is less than the height H of the non-interleaved surface profile 200, etc.).

According to an exemplary embodiment, the intensity of the diffracted light is related to the degree or amount of periodicity of the laser ablated surface (e.g., the periodic nature of the profile, how periodic the profile is, etc.). Therefore, since the interleaving laser ablation process provides the interleaved surface profile 300 that is less periodic relative to the non-interleaved surface profile 200 provided by the non-interleaving laser ablation process, the maximum amount of light diffracted at any particular angle may be lower for the interleaved surface profile 300. The diffracted light pattern for the interleaved surface profile 300 may thereby be less objectionable relative to the non-interleaved surface profile 200.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A product comprising:
   a substrate that is at least partially transparent to visible light;
   a conductive layer and a coating layer disposed over at least a portion of the substrate; and
   an ablated area on the conductive layer, the ablated area including an interleaved surface profile having a plurality of non-overlapped laser spots and a plurality of overlapped laser spots formed by subjecting the substrate to an interleaving laser ablation process;
   wherein there are no gaps between the plurality of non-overlapped laser spots and the plurality of overlapped laser spots within the ablated area; and
   wherein the conductive layer includes a transparent conductive oxide and the coating layer includes a metallic material that is at least partially removed from the conductive layer during the interleaving laser ablation process.

2. The product of claim 1, wherein the plurality of non-overlapped laser spots have a substantially circular shape.

3. The product of claim 1, wherein the plurality of non-overlapped laser spots cover greater than 1% of a total surface area of the ablated area.

4. The product of claim 3, wherein the plurality of non-overlapped laser spots cover greater than 10% of the total surface area of the ablated area.

5. The product of claim 4, wherein the plurality of non-overlapped laser spots cover greater than 25% of the total surface area of the ablated area.

6. The product of claim 5, wherein the plurality of non-overlapped laser spots cover greater than 50% of the total surface area of the ablated area.

7. The product of claim 1, wherein the interleaved surface profile of the ablated area provides a diffraction severity of less than about 5.

8. The product of claim 1, wherein the substrate has a first side and an opposing second side, wherein the conductive layer and the coating layer are disposed over the substrate on the opposing second side such that the interleaving laser ablation process is a second surface interleaving laser ablation process where a laser beam passes through the first side of the substrate to interact with the conductive layer and the coating layer on the opposing second side.

9. The product of claim 1, wherein the substrate includes glass.

10. The product of claim 1, wherein the product is configured to be incorporated into a mirror device, the mirror device including at least one of a dimming mirror assembly, a chrome ring product, or an electrochromic mirror assembly.

11. The product of claim 1, wherein the substrate is a first substrate, and further comprising a second substrate spaced from the first substrate forming a gap there between.

12. The product of claim 11, wherein the product is an electrochromic mirror assembly, and wherein the first substrate is an interior mirror of the electrochromic mirror assembly.

13. The product of claim 1, wherein the product is a dimming mirror assembly.

14. A product comprising:
   a substrate that is at least partially transparent to visible light;
   at least one of a conductive layer or a coating layer disposed over at least a portion of the substrate; and
   an ablated area along the substrate, the ablated area including an interleaved surface profile having a first plurality of laser spots and a second plurality of laser spots formed by subjecting the substrate to an interleaving laser ablation process;
   wherein there are no gaps between the first plurality of laser spots and the second plurality of laser spots within the ablated area;
   wherein the first plurality of laser spots have an appearance of not being overlapped by the second plurality of laser spots; and
   wherein the first plurality of laser spots have a shape different than the second plurality of laser spots.

15. The product of claim 14, wherein the product includes the conductive layer and the coating layer, and wherein the interleaved surface profile is on the conductive layer.

16. The product of claim 14, wherein the product does not include the conductive layer, wherein the interleaved surface profile is on a surface of the substrate.

17. The product of claim 14, wherein the first plurality of laser spots have a substantially circular shape and the second plurality of laser spots have a non-circular shape.

18. A product comprising:
   a substrate that is at least partially transparent to visible light;
   a conductive layer disposed over the substrate, the conductive layer having a first portion and a second portion;
   a coating layer disposed over the first portion of the conductive layer; and
   an ablated area along the second portion of the conductive layer, the ablated area including an interleaved surface profile having a plurality of non-overlapped laser spots and a plurality of overlapped laser spots;
   wherein the coating layer is entirely removed from the second portion by subjecting the second portion to an interleaving laser ablation process that forms the plurality of non-overlapped laser spots and the plurality of overlapped laser spots.

* * * * *